(12) United States Patent
Houssameddine et al.

(10) Patent No.: US 10,374,154 B1
(45) Date of Patent: Aug. 6, 2019

(54) METHODS OF SHIELDING AN EMBEDDED MRAM ARRAY ON AN INTEGRATED CIRCUIT PRODUCT COMPRISING CMOS BASED TRANSISTORS

(71) Applicant: GLOBALFOUNDRIES Singapore Pte Ltd, Singapore (SG)

(72) Inventors: Dimitri Houssameddine, Singapore (SG); Chenchen Jacob Wang, Singapore (SG); Bin Liu, Singapore (SG)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/874,205

(22) Filed: Jan. 18, 2018

(51) Int. Cl.
  *H01L 21/30* (2006.01)
  *H01L 27/22* (2006.01)
  *H01L 43/12* (2006.01)
  *H01L 43/08* (2006.01)

(52) U.S. Cl.
  CPC .......... *H01L 43/12* (2013.01); *H01L 27/228* (2013.01); *H01L 21/3003* (2013.01); *H01L 43/08* (2013.01)

(58) Field of Classification Search
  CPC . H01L 27/0688; H01L 27/226; H01L 27/101; H01L 27/1156; H01L 27/1225; H01L 29/24; H01L 29/7782; H01L 43/02; H01L 43/08; H01L 43/12; H01L 27/228
  USPC ......................................................... 438/199
  See application file for complete search history.

(56) References Cited

U.S. PATENT DOCUMENTS

| | | | |
|---|---|---|---|
| 6,143,632 A | 11/2000 | Ishida et al. | |
| 6,143,634 A * | 11/2000 | Wallace | H01L 21/28176 257/E21.194 |
| 6,151,241 A | 11/2000 | Hayashi et al. | |
| 6,218,245 B1 | 4/2001 | Xiang et al. | |
| 6,613,586 B2 | 9/2003 | Bailey | |
| 6,833,306 B2 | 12/2004 | Lyding et al. | |
| 6,864,551 B2 * | 3/2005 | Tsang | H01L 27/228 257/295 |
| 6,975,019 B2 | 12/2005 | Hazama | |
| 7,125,768 B2 | 10/2006 | Reinberg | |

(Continued)

FOREIGN PATENT DOCUMENTS

| | | |
|---|---|---|
| WO | 2016/064514 A1 | 4/2016 |
| WO | 2017/111826 A1 | 6/2017 |

OTHER PUBLICATIONS

Office Action from related U.S. Appl. No. 15/874,077 dated Jul. 13, 2018.
(Continued)

*Primary Examiner* — Duy T Nguyen
(74) *Attorney, Agent, or Firm* — Amerson Law Firm, PLLC

(57) ABSTRACT

One illustrative method disclosed herein includes forming an MRAM memory array and a plurality of peripheral circuits for an integrated circuit product above a semiconductor substrate, forming a patterned layer of a metal-containing shielding material above the substrate, the patterned layer of metal-containing shielding material covering the MRAM memory array while leaving an area above the plurality of peripheral circuits exposed, and, with the patterned layer of metal-containing shielding material in position, performing a silicon dangling bond passivation anneal process on the integrated circuit product.

16 Claims, 7 Drawing Sheets

(56) References Cited

U.S. PATENT DOCUMENTS

| | | | |
|---|---|---|---|
| 7,545,662 B2* | 6/2009 | Wang | G11O 5/025 |
| | | | 257/659 |
| 8,536,683 B2* | 9/2013 | Barth | H01L 23/552 |
| | | | 257/659 |
| 8,993,400 B1 | 3/2015 | Ramkumar et al. | |
| 9,136,464 B1 | 9/2015 | Whig et al. | |
| 9,293,182 B2 | 3/2016 | Houssameddine | |
| 9,419,208 B2 | 8/2016 | Whig et al. | |
| 9,548,095 B2 | 1/2017 | Houssameddine et al. | |
| 9,646,850 B2 | 5/2017 | Pethe et al. | |
| 2001/0044186 A1* | 11/2001 | Reinberg | H01L 27/115 |
| | | | 438/264 |
| 2002/0175358 A1 | 11/2002 | Yamamichi | |
| 2005/0009210 A1 | 1/2005 | Hosotani | |
| 2010/0072566 A1 | 3/2010 | Kang et al. | |
| 2013/0019944 A1* | 1/2013 | Hekmatshoar-Tabari | |
| | | | H01L 31/03762 |
| | | | 136/258 |
| 2013/0119496 A1 | 5/2013 | Zeng | |
| 2016/0163254 A1* | 6/2016 | Lee | G06T 1/60 |
| | | | 345/545 |
| 2016/0196951 A1 | 7/2016 | Ohsawa et al. | |
| 2016/0351792 A1 | 12/2016 | Jiang et al. | |
| 2017/0047507 A1* | 2/2017 | Seo | H01L 23/552 |
| 2018/0277750 A1 | 9/2018 | Kim et al. | |

OTHER PUBLICATIONS

Office Action from related application U.S. Appl. No. 15/874,077 dated Apr. 18, 2019.

* cited by examiner

METHODS OF SHIELDING AN EMBEDDED MRAM ARRAY ON AN INTEGRATED CIRCUIT PRODUCT COMPRISING CMOS BASED TRANSISTORS

BACKGROUND OF THE INVENTION

1. Field of the Invention

The present disclosure generally relates to the fabrication of integrated circuits, and, more particularly, to various methods of shielding an embedded MRAM (Magnetic Random Access Memory) array on an integrated circuit (IC) product comprising CMOS based transistors embodiments.

2. Description of the Related Art

Memory arrays based upon MRAM cells have drawn greater interest in recent years given that they combine high processing speeds, can be accessed like other random access memory devices and because they exhibit the nonvolatility of random access memory devices. Each MRAM cell includes a top electrode, a bottom electrode and an MTJ (Magnetic Tunnel Junction) element positioned between the top and bottom electrodes. The MTJ element may be comprised of a variety of different materials, e.g., a first pinned ferromagnetic material layer, a tunnel barrier layer and a second free ferromagnetic material layer. Each MRAM cell is operatively coupled to a read switching element that is formed in a semiconductor substrate.

In modern IC products, embedded MRAM arrays are formed on a common semiconductor substrate at the same time other CMOS based transistor devices are being formed on the substrate for other non-memory circuits, e.g., logic circuits. The performance and stability of the CMOS based transistors may be enhanced by being subjected to a relatively high temperature/high pressure anneal process (in, for example, an ambient comprising hydrogen and deuterium) so as to passivate silicon dangling bonds in the channel and/or source/drain regions of the transistor devices. However, the anneal process damages several magnetic properties of the MRAM cells, which is detrimental to the performance of the MRAM cells and memory arrays incorporating such MRAM cells.

The present disclosure is directed to various methods, structures and devices for shielding an embedded MRAM array on an IC product comprising CMOS based transistors.

SUMMARY OF THE INVENTION

The following presents a simplified summary of illustrative embodiments of the invention in order to provide a basic understanding of some aspects of the illustrative embodiments of the invention. This summary is not an exhaustive overview of the illustrative embodiments of the invention specifically discussed herein. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, devices and structures for shielding an embedded MRAM array on an IC product comprising CMOS based transistors. One illustrative method disclosed herein includes forming an MRAM memory array and a plurality of peripheral circuits for an integrated circuit product above a semiconductor substrate, forming a patterned layer of a metal-containing shielding material above the substrate, the patterned layer of metal-containing shielding material covering the MRAM memory array while leaving an area above the plurality of peripheral circuits exposed, and, with the patterned layer of metal-containing shielding material in position, performing a silicon dangling bond passivation anneal process on the integrated circuit product.

Another illustrative method disclosed herein includes forming an MRAM memory array and a plurality of peripheral circuits for an integrated circuit product above a semiconductor substrate, forming a patterned layer of a shielding insulating material above the substrate, the patterned layer of shielding insulating material covering the MRAM memory array while leaving an area above the plurality of peripheral circuits exposed, and, with the patterned layer of shielding insulating material in position, performing a silicon dangling bond passivation anneal process on the integrated circuit product.

One illustrative integrated circuit product disclosed herein includes an MRAM memory array and a plurality of peripheral circuits for the integrated circuit product above a semiconductor substrate and a patterned layer of a metal-containing shielding material positioned above the substrate, the patterned layer of metal-containing shielding material covering the MRAM memory array while leaving an area above the plurality of peripheral circuits exposed.

BRIEF DESCRIPTION OF THE DRAWINGS

The disclosure may be understood by reference to the following description taken in conjunction with the accompanying drawings, in which like reference numerals identify like elements, and in which.

Figure 1:
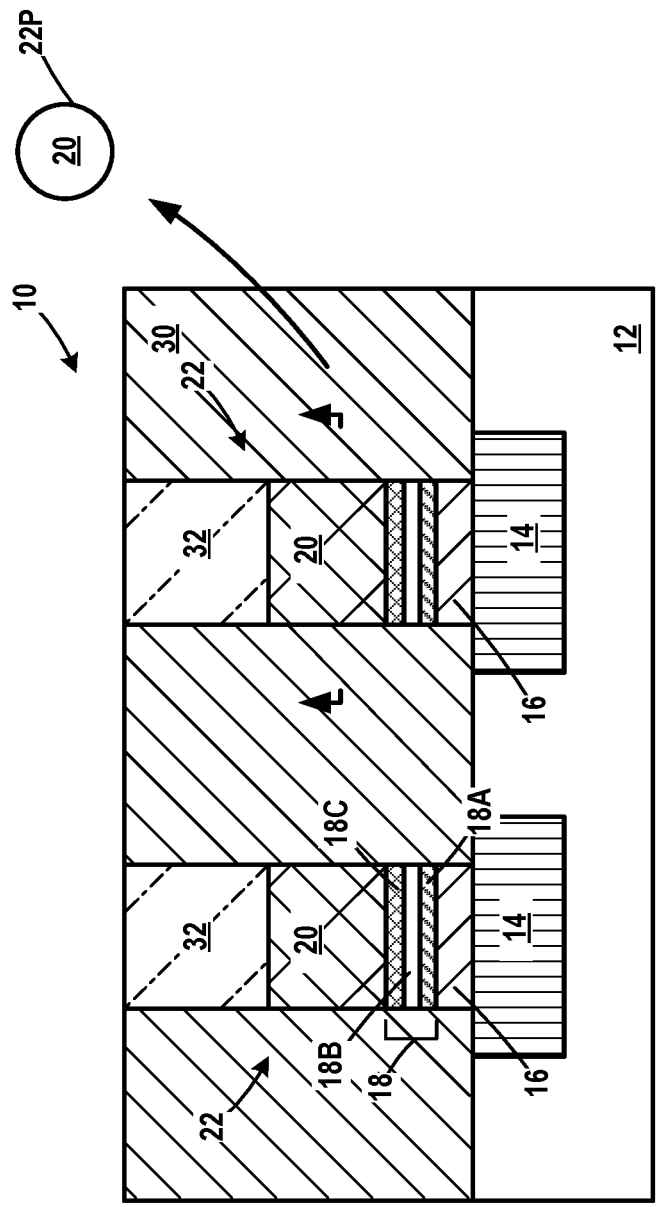
FIGS. 1-7 depict various methods and products disclosed herein for shielding an embedded MRAM array on an IC product comprising CMOS based transistors.

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods, devices and structures for shielding an embedded MRAM array on an IC product comprising CMOS based transistors. As will be readily apparent to those skilled in the art upon a complete reading of the present application, the present method may be employed in manufacturing MRAM arrays in a variety of different integrated circuit (IC) products. With reference to the attached figures, various illustrative embodiments of the methods and devices disclosed herein will now be described in more detail. The various components and structures of the devices disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

FIGS. 1-7 depict various methods and devices disclosed herein for shielding an embedded MRAM array on an IC product 10 comprising CMOS based transistors. The IC product 10 will be formed in and above a semiconductor substrate 35 (see FIG. 3). The substrate 35 may have a variety of configurations, such as the bulk substrate configuration depicted herein or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer, wherein the devices disclosed herein are formed in and above the active layer. The active layer and/or the bulk semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials.

FIG. 1 depicts the product 10 after several process operations were performed to form a plurality of MRAM cells 22 above a layer of insulating material 12 (e.g., silicon dioxide, a low-k (k value less than 3.3) material) that was formed above the substrate 35 (not shown in FIG. 1). Also depicted in FIG. 1 is a plurality of conductive structures 14 (e.g., conductive vias) that were formed in the layer of insulating material 12. The conductive structures 14 may be comprised of any conductive material, they may be of any desired configuration, and they may be manufactured using any of a variety of different manufacturing techniques (e.g., single or dual damascene). As will be appreciated by those skilled in the art after a complete reading of the present application, each of the conductive structures 14 will be conductively coupled to a bottom electrode of one of the MRAM cells 22 disclosed herein.

Still referencing FIG. 1, each of the illustrative MRAM cells 22 disclosed herein comprises a bottom electrode 16, an MTJ (Magnetic Tunnel Junction) element 18 (comprised of a plurality of layers 18A-C) and a top electrode 20. The MTJ element 18 depicted herein is intended to be representative of any type of MTJ element 18 formed for MRAM cells. The MTJ element 18 depicted herein may be comprised of a variety of different materials, with a variety of different thicknesses, that are arranged in a variety of different configurations. In one illustrative embodiment, the MTJ element 18 may be comprised of a first pinned ferromagnetic material layer 18A (e.g., Co/Pt or Co/Ni multilayer, a CoFeB alloy), a tunnel barrier layer 18B (e.g., MgO or $Al_2O_3$) and a second free ferromagnetic material layer 18C (e.g., a CoFeB-based alloy). Also depicted in FIG. 1 are illustrative separate conductive contact structures 32 (e.g., conductive vias) that were formed in a layer of insulating material 30 (e.g., silicon dioxide, a low-k (k value less than 3.3) material) that was formed above the layer of insulating material 12. The conductive contact structures 32 conductively contact the top electrodes 20 of the MRAM cells 22. The conductive contact structures 32 may be comprised of any conductive material, they may be of any desired configuration, and they may be manufactured using any of a variety of different manufacturing techniques (e.g., single or dual damascene).

The bottom electrode 16 may be formed to any desired thickness and it may be formed of any conductive material, e.g., a metal-containing material, a metal compound, etc. In one illustrative embodiment, the bottom electrode 16 may be comprised of tantalum nitride. The top electrode 20 may be formed to any desired thickness and it may be formed of any conductive material, e.g., a metal-containing material, a metal compound, etc. In one illustrative embodiment, the top electrode 20 may be comprised of tantalum nitride. The bottom and top electrodes 16, 20 need not be formed of the same conductive material (nor the same thickness), but that situation may occur in some applications.

Figure 2:
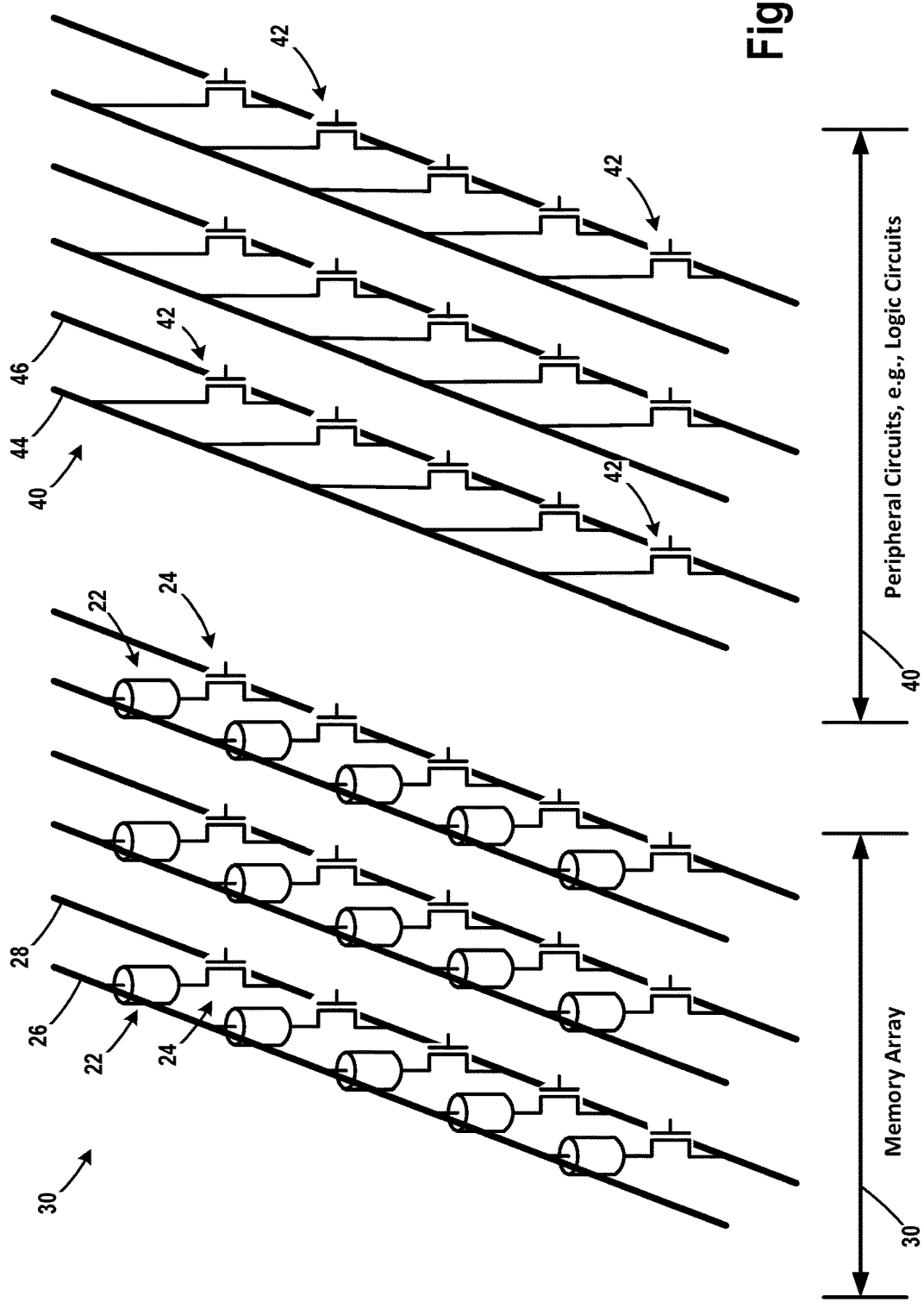
Figure 3:
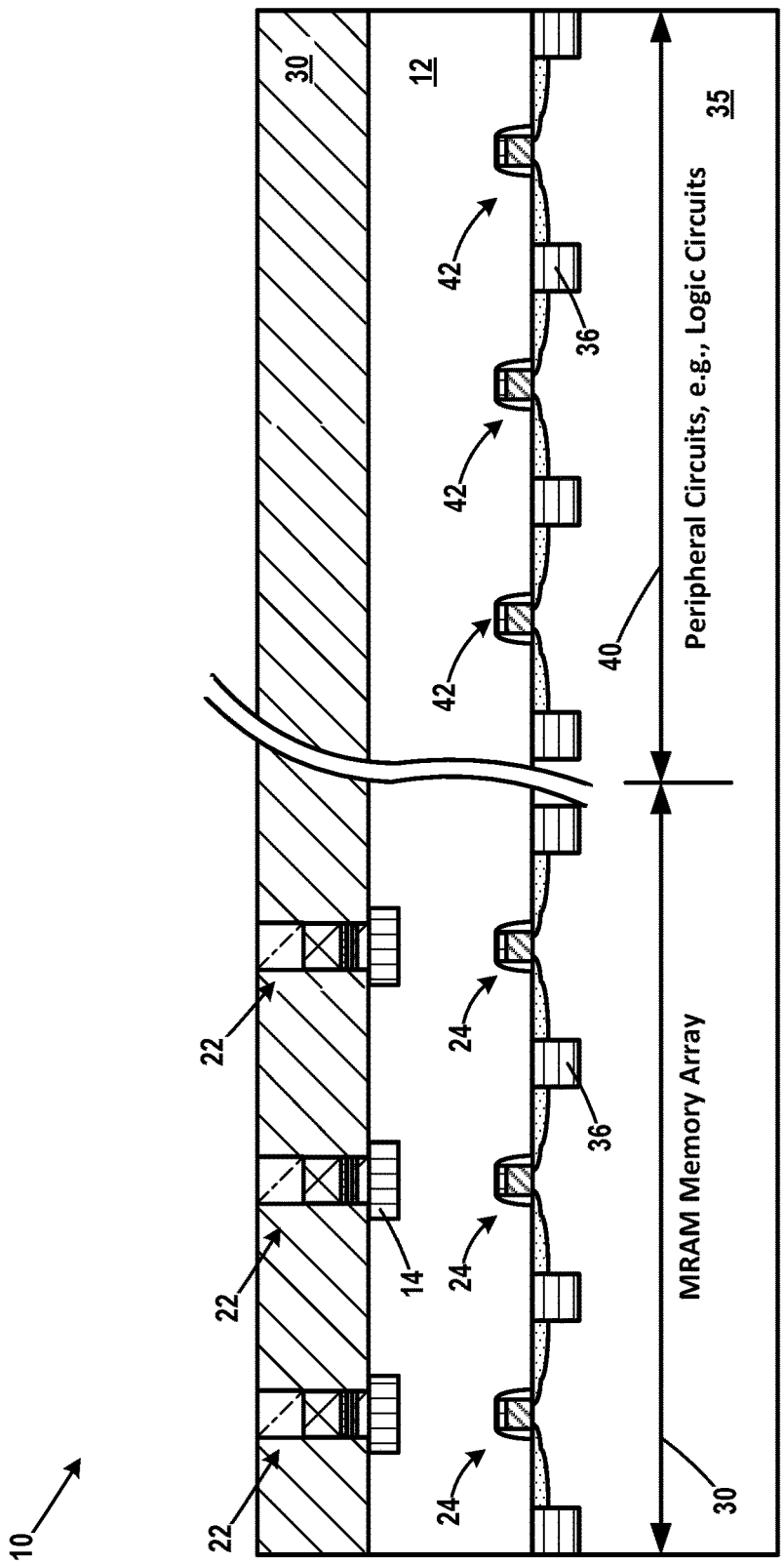

With reference to FIGS. 2 and 3, prior to forming the MRAM cells 22, various transistor devices 24, 42 (not shown in FIG. 1), as well as various conductive contact structures (not shown in FIG. 2 or 3) that are coupled to those transistor devices 24, 42, were formed in and above the semiconductor substrate 35. As shown in FIG. 3, the simplistically depicted transistors 24, 42 are separated by isolation regions 36 formed in the substrate 35. Each of the MRAM cells 22 will be operatively coupled to a single transistor 24 that functions as a read switching element for the MRAM cell 22. The other CMOS based transistors 42 may be formed for other non-memory circuits (such as peripheral logic circuits) that are formed for the product 10 using traditional manufacturing techniques. As shown in FIG. 2, the MRAM cells 22 are arranged in an MRAM Memory Array 30 that is formed above the substrate 35. The various CMOS based transistors 42 are positioned in another section of the product 10, such as in one or more peripheral circuits 40, e.g., logic circuits. The MRAM Memory Array 30 and the peripheral circuits 40 may be positioned laterally adjacent one another on the substrate 35 or they may be separated from one another by relatively large distances. As shown in FIG. 2, the top electrode of each MRAM cell 22 is conductively coupled to a separate bitline 26, while the read-switching transistor 24 is conductively coupled to a separate source line 28. One of the source/drain regions of each of the read-switching transistors 24 is conductively coupled to the bottom electrode 16 of one of the MRAM cells 22. The source/drain regions of the CMOS based transistors 42 in the peripheral circuits 40 are conductively coupled to separate conductive lines 44 and separate conductive lines 46. Of course, the depicted arrangement and configuration of the CMOS based transistors 42 in the illustrative peripheral circuits 40 depicted herein are provided by way of example only, as the peripheral circuits 40 depicted herein are intended to be representative of any type or form of integrated circuits that are formed on the substrate 35 based upon any type or form of CMOS based transistors 42.

Figure 4:
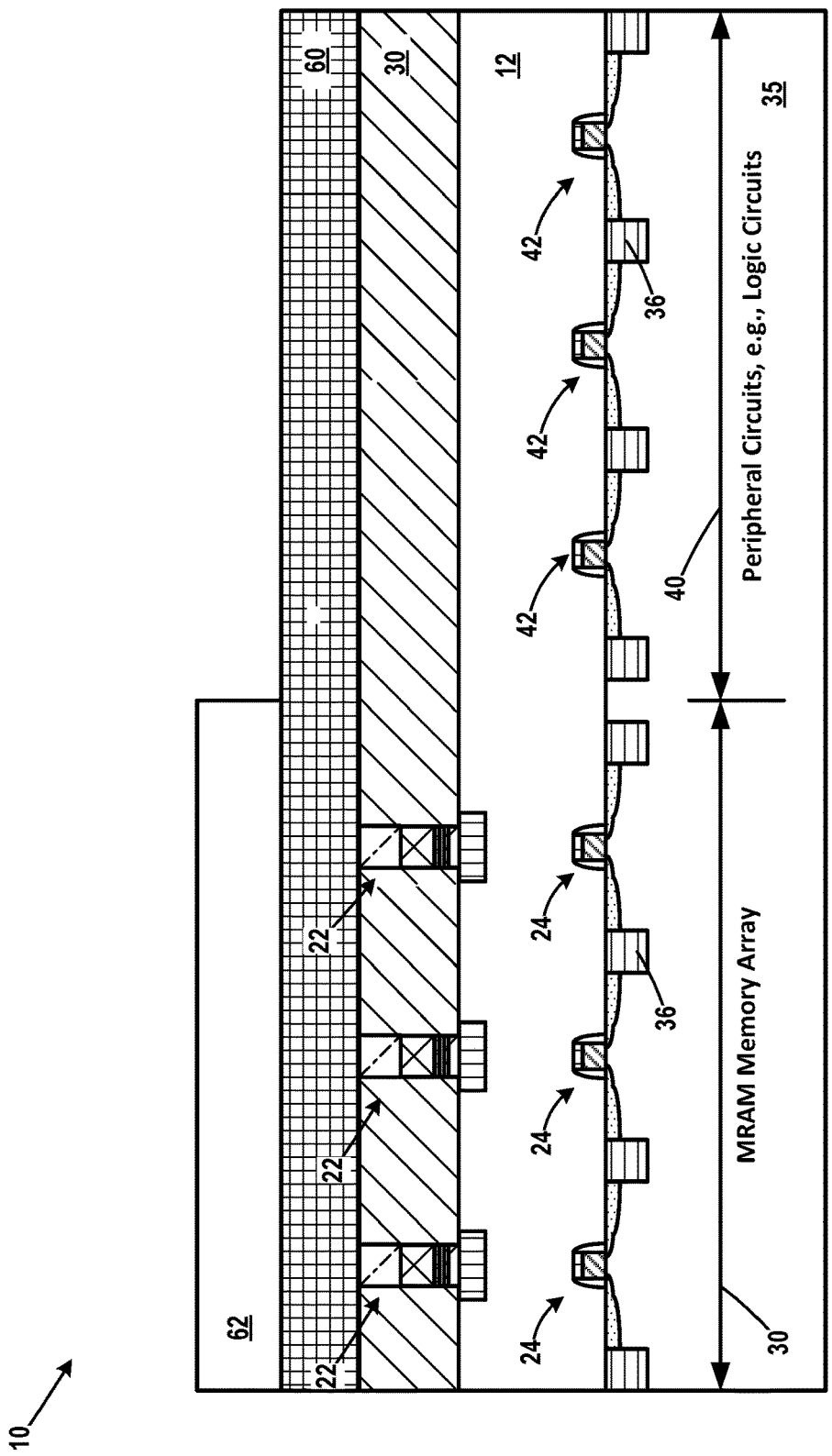

FIG. 4 depicts the product 10 after several process operations were performed. First, a blanket deposition process (e.g., CVD, PVD, ALD or IBD) was performed to form a continuous layer of shielding material 60 above the layer of insulating material 30 across the entire substrate 35. As depicted, as this point, the layer of shielding material 60 covers both the MRAM Memory Array 30 and all of the peripheral circuits 40 formed above the substrate 35. Thereafter, a patterned etch mask 62 was formed above the layer of shielding material 60. As depicted, the patterned etch mask 62 covers the portion of the layer of shielding material 60 positioned above the MRAM Memory Array 30 but leaves the portion of the layer of shielding material 60 positioned above the peripheral circuits 40 exposed. The patterned etch mask 62 may be a patterned layer of photoresist or it may be a patterned hard mask layer comprised of one or more layers of material, e.g., a patterned layer of silicon nitride.

The thickness and material for the layer of shielding material 60 may vary depending upon the particular application. In one illustrative embodiment, the layer of shielding material 60 may be formed to a thickness of about 10-1000 nm. In terms of materials, in one illustrative embodiment, the layer of shielding material 60 may be a metal-containing layer of material, such as, for example, a layer of substantially pure metal, a metal alloy, a metal oxide, tungsten, tantalum, ruthenium, platinum, aluminum, etc. In one illustrative embodiment, such a layer of metal-containing shielding material 60 may comprise at least 30% metal (atomic percentage). In one illustrative embodiment, such a layer of metal-containing shielding material 60 may comprise enough metal such that the layer of metal-containing shielding material constitutes an electrically conductive material. In yet other embodiments, such a layer of metal-containing shielding material 60 may be a layer of substantially pure metal. In yet another illustrative embodiment, the layer of shielding material 60 may be comprised of a layer of shielding insulating material (i.e., a dielectric material) such as, for example, silicon dioxide, silicon nitride, nitrogen-doped silicon carbide, silicon oxynitride, silicon oxycarbide, silicon oxycarbide nitride, aluminum oxide, titanium oxide, tantalum oxide or a low-k material (k value of 8 or less), etc.

Figure 5:
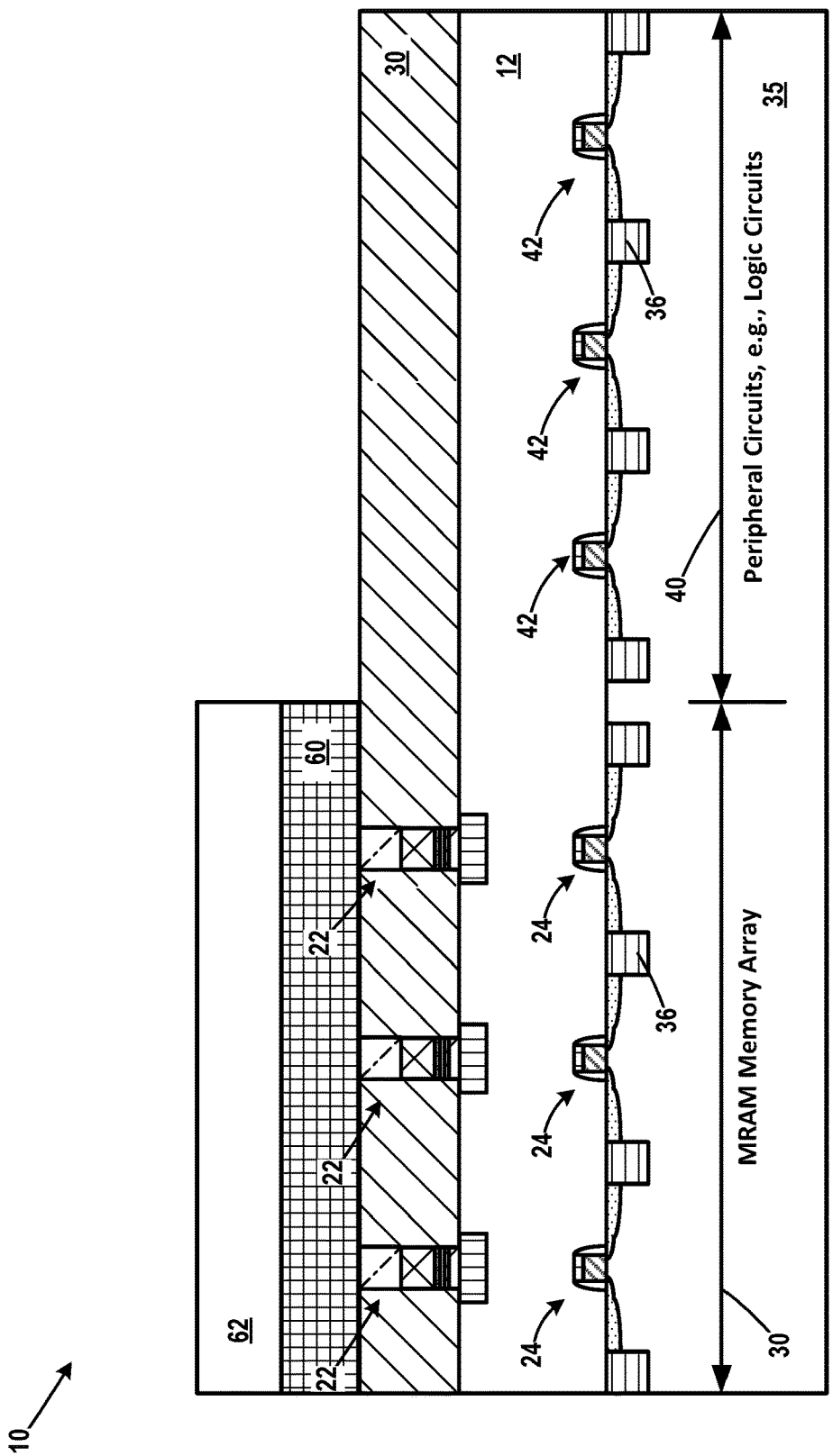

FIG. 5 depicts the product 10 after an anisotropic etching process was performed through the patterned etch mask 62 to remove exposed portions of the layer of shielding material 60. As depicted, the patterned layer of shielding material 60 covers the MRAM Memory Array 30 but leaves the area(s) above the peripheral circuits 40 exposed. The patterned etch mask 62 may or may not be removed after the patterning of the layer of shielding material 60 is completed. In the example depicted herein, the patterned etch mask 62 will be removed after the completion of this etching process.

Figure 6:
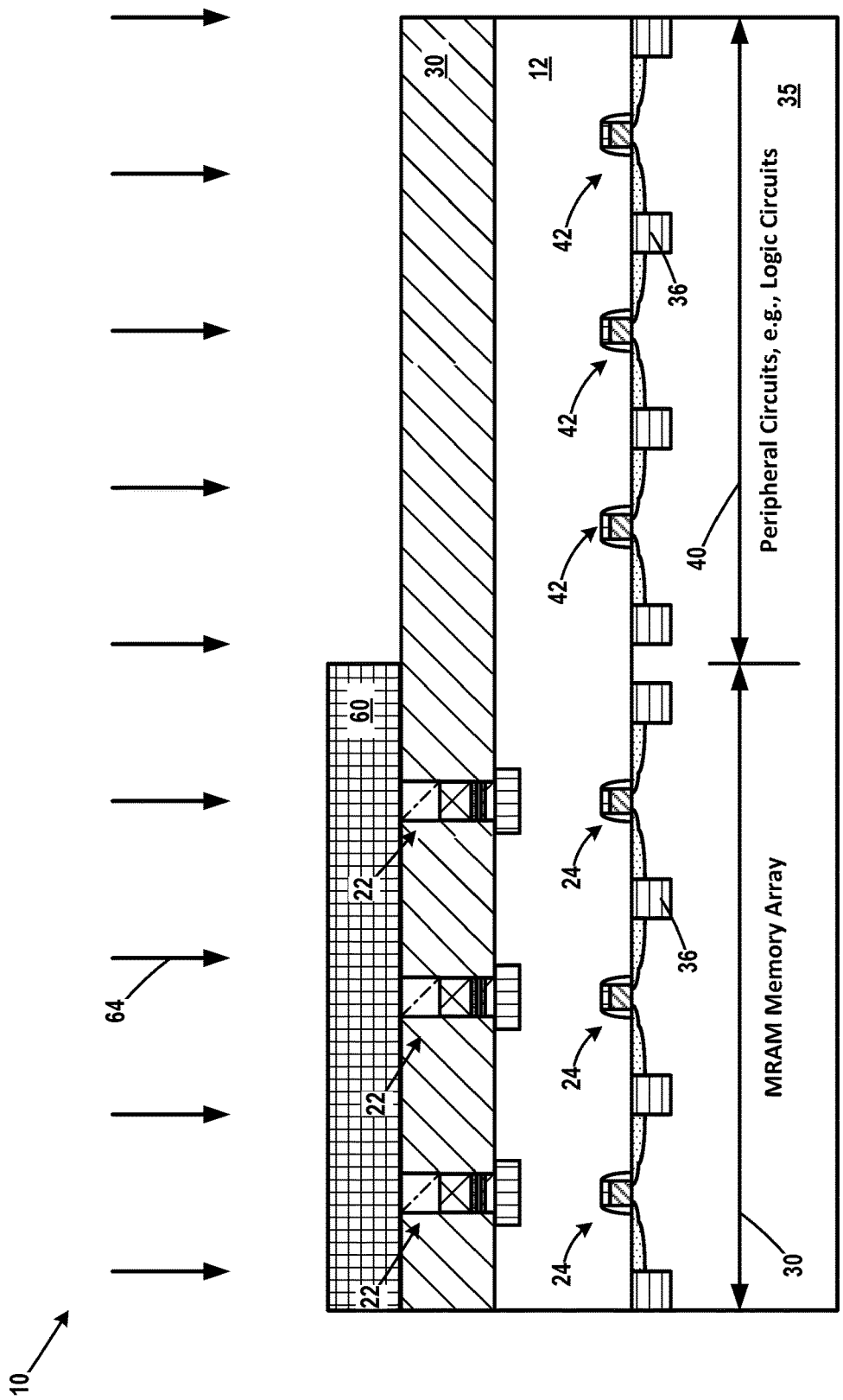

As shown in FIG. 6, the entire product 10 is subjected to an anneal process 64 so as to passivate dangling silicon bonds in the channel and/or source/drain regions of the transistor devices 24, 42. In one illustrative example, the passivation anneal process is performed after all of the metal layers of the metallization system for the product have been formed, i.e., after all back-end-of-line processing activities have been completed. The presence of these dangling silicon bonds can reduce the performance of the transistor devices 24, 42. Thus, in one illustrative embodiment, the anneal process 64 may be performed on the product 10 at relatively elevated pressures and temperatures in an ambient comprising hydrogen ($H_2$) and deuterium ($D_2$) gases. During this silicon dangling bond passivation anneal process 64, atoms from the gases are released and bond with the dangling silicon bonds such that the former dangling silicon bonds are terminated by silicon-hydrogen bonds as well as silicon-deuterium bonds. The anneal process 64 may be performed using other gases as well, e.g., nitrogen, etc. The silicon dangling bond passivation anneal process 64 is somewhat directional (i.e., vertical in nature). The silicon dangling bond passivation anneal process 64 improves the operational characteristics and reliability of various transistor devices formed above the substrate 35. However, absent formation of the layer of shielding material 60 above the MRAM Memory Array 30, the silicon dangling bond anneal process 64 would damage several magnetic properties of the MRAM cells 22, which is detrimental to the performance of the MRAM cells 22 and the MRAM Memory Array 30. Additionally, the improved performance and reliability of the read-switching transistors 24 in the MRAM Memory Array 30 as a result of performing the anneal process 64 does not significantly increase the operational performance of a MRAM Memory Array 30 comprised of the MRAM cells 22.

However, using the various methods disclosed herein that involve formation of a protective patterned layer of shielding material 60 above the MRAM Memory Array 30, the silicon dangling bond passivation anneal process 64 may be performed at some point after the formation of all of the transistor devices 24, 42 on the substrate 35 and after the formation of the MRAM cells 22 for the MRAM Memory Array 30. The formation of the layer of shielding material 60 selectively above the MRAM Memory Array 30 at least reduces or prevents the ability of the diffusing atoms released during the silicon dangling bond passivation anneal process 64 to penetrate the MRAM cells 22. Accordingly, the formation of the layer of shielding material 60 above the MRAM Memory Array 30 at least reduces, if not prevents, unacceptable levels of damage to the magnetic properties of the MRAM cells 22 disclosed herein during the anneal process 64. Moreover, the methods disclosed herein still permit the above-described silicon dangling bond passivation anneal process 64 to be performed on an IC product 10 after the formation of the MRAM cells 22 disclosed herein, thereby providing the desired increased performance and stability for the CMOS transistors 42 formed in the various peripheral circuits 40 of the product 10, while at the same time preventing damage to the magnetic properties of the MRAM cells 22 in the MRAM Memory Array 30.

Figure 7:
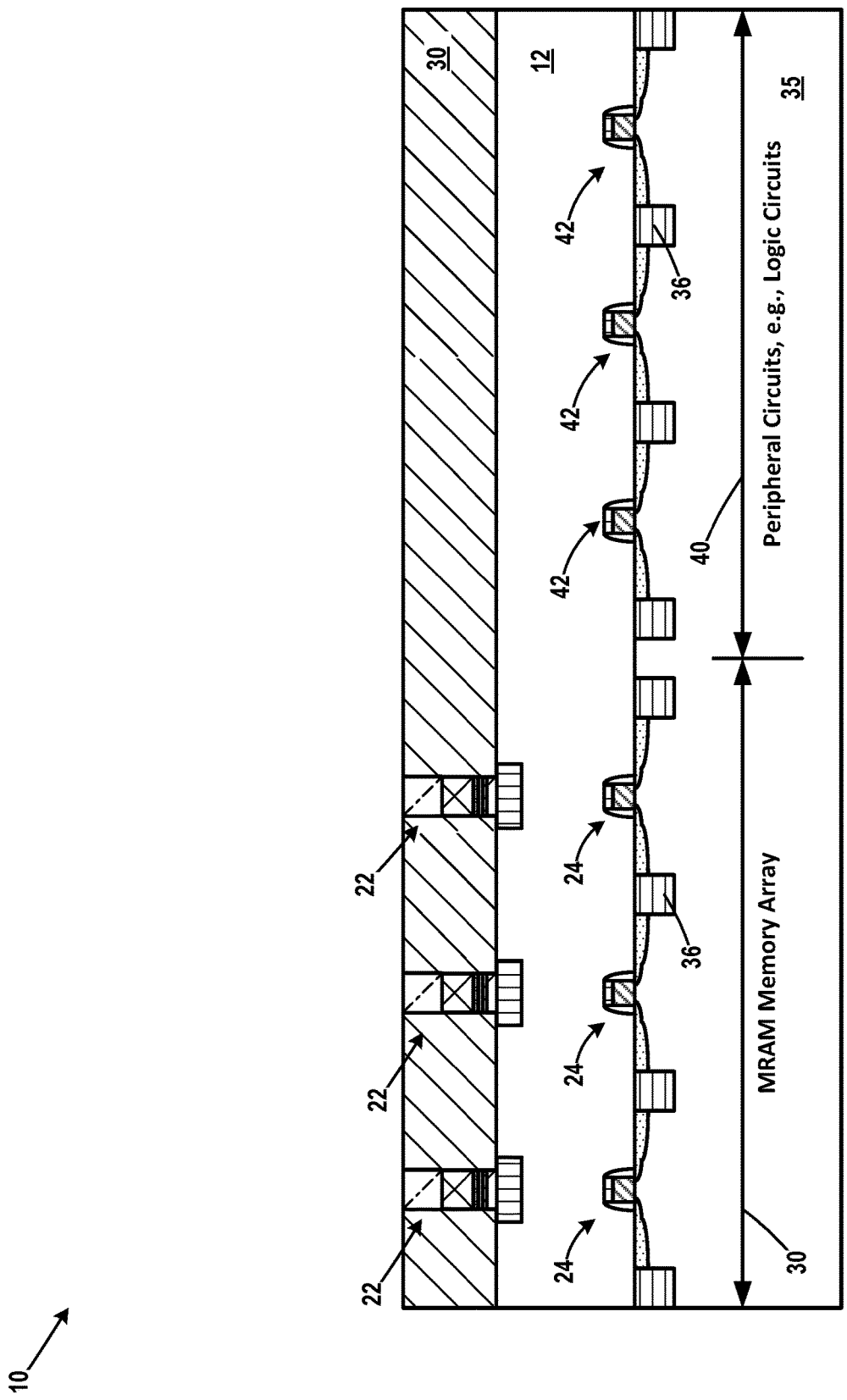

FIG. 7 depicts the product 10 after the patterned layer of shielding material 60 was removed. However, in some applications, the patterned layer of shielding material 60 may not be removed. At this point, traditional manufacturing operations may be performed to complete the fabrication of the IC product 10.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming an integrated circuit product, comprising:
    forming an MRAM memory array and a plurality of peripheral circuits for said integrated circuit product above a semiconductor substrate;
    forming a patterned layer of a metal-containing shielding material above said semiconductor substrate, said patterned layer of metal-containing shielding material covering said MRAM memory array while leaving an area above said plurality of peripheral circuits exposed; and
    with said patterned layer of metal-containing shielding material in position, performing a silicon dangling bond passivation anneal process on said integrated circuit product.

2. The method of claim 1, further comprising removing said patterned layer of metal-containing shielding material.

3. The method of claim 1, wherein forming said patterned layer of metal-containing shielding material comprises:
    blanket-depositing a continuous layer of metal-containing shielding material above said semiconductor substrate;
    forming a patterned etch mask above said continuous layer of metal-containing shielding material, said patterned etch mask covering a first portion of said continuous layer of metal-containing shielding material positioned above said MRAM memory array while exposing a second portion of said continuous layer of metal-containing shielding material above said plurality of peripheral circuits; and
    with said patterned etch mask in position, performing at least one etching process to remove said exposed second portion of said continuous layer of metal-containing shielding material so as to thereby form said patterned layer of metal-containing shielding material.

4. The method of claim 3, further comprising removing said patterned etch mask prior to performing said silicon dangling bond passivation anneal process.

5. The method of claim 1, wherein performing said silicon dangling bond passivation anneal process comprises performing said silicon dangling bond passivation anneal process in an ambient comprising hydrogen (H2) and deuterium (D2).

6. The method of claim 1, wherein said patterned layer of metal-containing shielding material comprises one of a metal, a metal alloy, a metal oxide, tungsten, tantalum, ruthenium, platinum or aluminum and wherein said patterned layer of metal-containing shielding material has a thickness that falls within a range of about 10-1000 nm.

7. The method of claim 1, wherein said patterned layer of metal-containing material is electrically conductive.

8. The method of claim 1, wherein said patterned layer of metal-containing material comprises at least 30% metal (atomic percentage).

9. The method of claim 1, wherein forming said MRAM memory array comprises forming a plurality of MRAM cells for said MRAM memory array and forming said plurality of peripheral circuits comprises forming a plurality of logic circuits.

10. The method of claim 9, wherein each of said MRAM cells comprises:
    a bottom electrode;
    a top electrode; and
    a MTJ (Magnetic Tunnel Junction) element positioned above said bottom electrode and below said top electrode.

11. The method of claim 10, wherein said MTJ element comprises a first pinned ferromagnetic material layer positioned above said bottom electrode, a second free ferromagnetic material layer positioned below said top electrode and a tunnel barrier layer positioned above said first pinned ferromagnetic material layer and below said second free ferromagnetic material layer.

12. The method of claim 11, wherein forming said MRAM memory array further comprises forming a plurality of read-switching transistors, wherein each of said read-switching transistors is conductively coupled to only one of said plurality of MRAM cells in said MRAM memory array.

13. A method of forming an integrated circuit product, comprising:
    forming an MRAM memory array and a plurality of peripheral circuits for said integrated circuit product above a semiconductor substrate;
    forming a patterned layer of a shielding insulating material above said semiconductor substrate, said patterned layer of shielding insulating material covering said MRAM memory array while leaving an area above said plurality of peripheral circuits exposed; and
    with said patterned layer of shielding insulating material in position, performing a silicon dangling bond passivation anneal process on said integrated circuit product.

14. The method of claim 13, wherein forming said patterned layer of shielding insulating material comprises:
    blanket-depositing a continuous layer of said shielding insulating material above said semiconductor substrate;
    forming a patterned etch mask above said continuous layer of shielding insulating material, said patterned etch mask covering a first portion of said continuous layer of shielding insulating material positioned above said MRAM memory array while exposing a second portion of said continuous layer of shielding insulating material above said plurality of peripheral circuits; and
    with said patterned etch mask in position, performing at least one etching process to remove said exposed second portion of said continuous layer of shielding insulating material so as to thereby form said patterned layer of shielding insulating material.

15. The method of claim 13, wherein performing said silicon dangling bond passivation anneal process comprises performing said silicon dangling bond passivation anneal process to passivate dangling silicon bonds present in a plurality of CMOS based transistors formed for said plurality of peripheral circuits.

16. The method of claim 13, wherein forming said plurality of peripheral circuits comprises forming a plurality of logic circuits and wherein forming said MRAM memory array comprises forming a plurality of read-switching transistors, wherein each of said read-switching transistors is conductively coupled to only one of said plurality of MRAM cells in said MRAM memory array.

* * * * *